US010145517B1

(12) United States Patent
Anwer et al.

(10) Patent No.: US 10,145,517 B1
(45) Date of Patent: Dec. 4, 2018

(54) LIGHT EMITTING DIODE ARRAY ASSEMBLY

(71) Applicant: SWS Warning Systems, Inc., Niagara Falls (CA)

(72) Inventors: Umer Anwer, Niagara Falls (CA); Jerico Wong, St. Catharines (CA)

(*) Notice: Subject to any disclaimer, the term of this patent is extended or adjusted under 35 U.S.C. 154(b) by 465 days.

(21) Appl. No.: 14/102,674

(22) Filed: Dec. 11, 2013

(51) Int. Cl.
| F21V 19/00 | (2006.01) |
| F21K 99/00 | (2016.01) |
| F21K 9/90  | (2016.01) |
| F21Y 115/10| (2016.01) |
| F21V 17/00 | (2006.01) |
| H05K 3/36  | (2006.01) |
| F21V 17/10 | (2006.01) |

(52) U.S. Cl.
CPC .............. F21K 9/30 (2013.01); F21K 9/90 (2013.01); F21V 19/003 (2013.01); *F21V 17/005* (2013.01); *F21V 17/104* (2013.01); *F21V 19/0045* (2013.01); *F21Y 2115/10* (2016.08); *H05K 3/366* (2013.01); *H05K 2201/047* (2013.01); *H05K 2201/048* (2013.01)

(58) Field of Classification Search
CPC .... F21K 9/30; F21K 9/90; H05K 1/14; H05K 1/141; Y10T 29/49126
USPC .............. 362/249.02, 296.06, 362, 800, 646
See application file for complete search history.

(56) References Cited

U.S. PATENT DOCUMENTS

| 4,513,064 | A  | * | 4/1985  | Marcus    | H05K 3/366  |
|           |    |   |         |           | 361/803     |
| 5,567,036 | A  | * | 10/1996 | Theobald  | B60Q 1/2607 |
|           |    |   |         |           | 362/236     |
| 6,338,563 | B1 | * | 1/2002  | Norman    | F21L 14/02  |
|           |    |   |         |           | 362/268     |
| 6,525,668 | B1 | * | 2/2003  | Petrick   | F21V 21/116 |
|           |    |   |         |           | 340/473     |
| 2003/0072156 | A1 | * | 4/2003 | Pohlert  | G03B 15/02  |
|           |    |   |         |           | 362/244     |
| 2004/0207532 | A1 | * | 10/2004 | Smithson | G08B 5/38   |
|           |    |   |         |           | 340/643     |

(Continued)

OTHER PUBLICATIONS

Tower, retrieved on Sep. 19, 2016, retrieved from http://www.merriam-webster.com/dictionary/tower, 4 pages.

*Primary Examiner* — Zheng Song
(74) *Attorney, Agent, or Firm* — Brian S. Steinberger; Law Offices of Brian S. Steinberger, P.A.

(57) ABSTRACT

The present invention relates generally to LED (light emitting diode) array assemblies, and more specifically, to hi-powered LED array assemblies which are compact, cost-effective and easily assembled, while still addressing the issue of thermal management in such systems. An improved LED array assembly is described which is compact, cost-effective and easily assembled, while still addressing the issue of thermal management. An exemplary LED assembly consists of four separate and independent printed circuit boards (PCBs) which are arranged in an elongated square prism on a base PCB to form a "tower", the four PCBs being mechanically interconnected by means of complementary slots and tabs. Each of the vertically arranged PCBs supports and provides power to one or more LEDs. Other aspects of the invention are also described including a flared base, drainage openings, and retaining notches on the perimeter of the PCB tower.

22 Claims, 4 Drawing Sheets

(56) References Cited

U.S. PATENT DOCUMENTS

| | | | | |
|---|---|---|---|---|
| 2008/0106430 A1* | 5/2008 | Yeh | ............... | F21V 19/0055 340/815.73 |
| 2011/0140587 A1* | 6/2011 | Lee | ............... | F21K 9/135 313/46 |
| 2012/0243244 A1* | 9/2012 | Wan | ............... | F21V 19/001 362/432 |
| 2012/0313518 A1* | 12/2012 | Sun | ............... | F21V 29/2206 315/32 |
| 2013/0314292 A1* | 11/2013 | Maley | ............... | H01Q 1/1207 343/797 |
| 2014/0062713 A1* | 3/2014 | Skertich, Jr. | ............... | F21V 5/04 340/815.45 |
| 2014/0085072 A1* | 3/2014 | Clifford | ............... | B60Q 1/2611 340/472 |
| 2015/0029701 A1* | 1/2015 | Weidman | ............... | F21L 4/02 362/102 |
| 2016/0003463 A1* | 1/2016 | Rodinger | ............... | F21K 9/1355 362/249.02 |

* cited by examiner

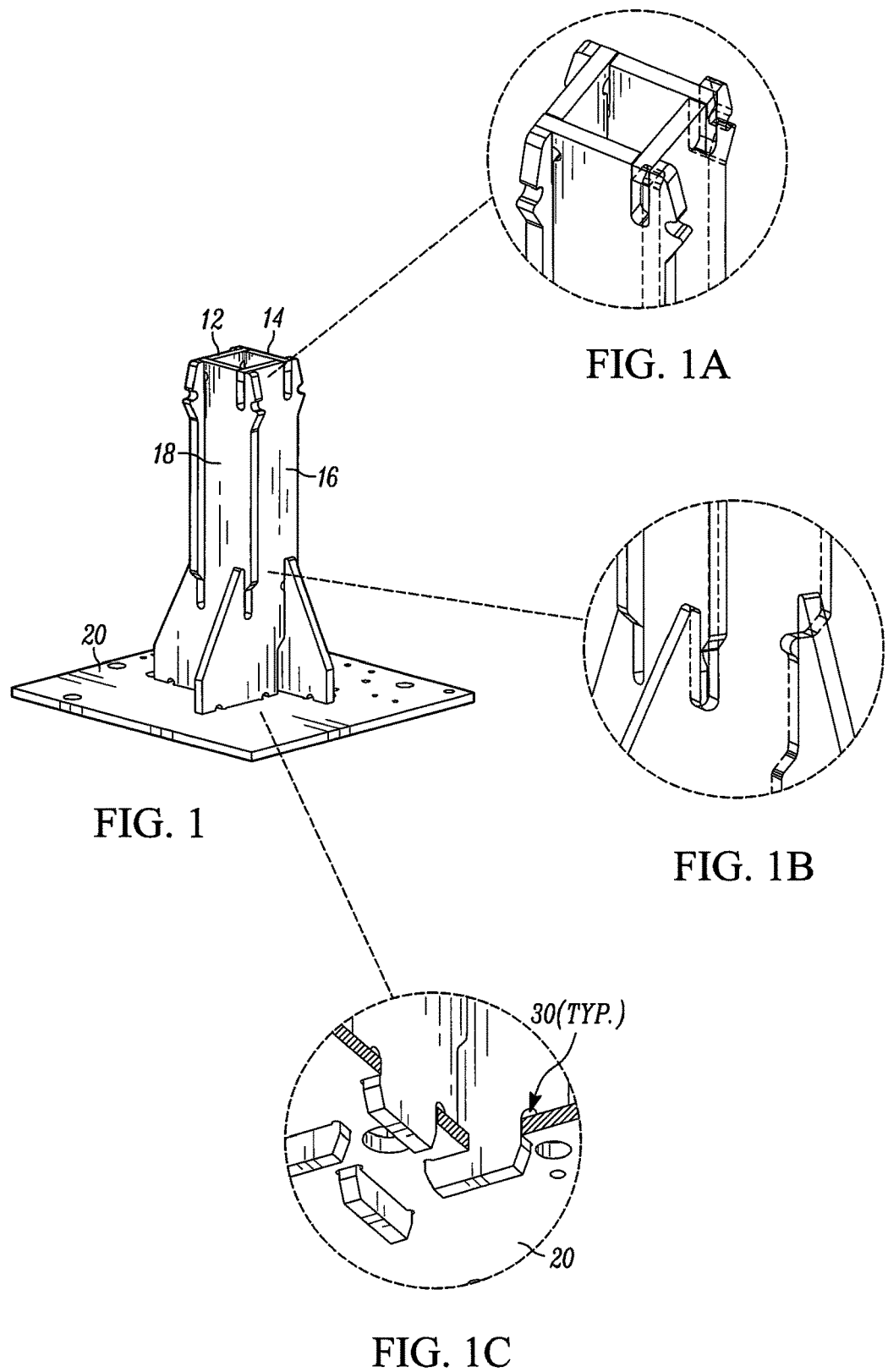

US 10,145,517 B1

LIGHT EMITTING DIODE ARRAY ASSEMBLY

CROSS REFERENCE TO RELATED APPLICATIONS

This application claims the benefit of priority to Canadian Patent Application Serial No. 2,835,561 filed Dec. 3, 2013, the entire application of which is incorporated by reference thereto.

The present invention relates generally to LED (light emitting diode) array assemblies, and more specifically, to hi-powdered LED array assemblies which are compact, cost-effective and easily assembled, while still addressing the issue of thermal management in such systems.

BACKGROUND

Solid-state light emitting diodes (LEDs) and hi-powered LEDs in particular, are becoming more and more common in both commercial and industrial applications due to characteristics such as good electrical efficiency, small size and weight, and rugged construction compared to other light sources such as incandescent bulbs. They are now frequently used in back-lighting units, street safety applications (including streetlights, traffic signals, traffic directors and arrows), automotive lighting applications (including emergency vehicle warning lights) and industrial applications in the form of warning lights and beacons, strobes, mini-bars, and the like.

As the LED market grows, companies that provide LED-based products are continually looking for ways of making their lighting systems more efficient and reliable, as well as making them more cost-effective for their consumers. A major consideration in the design of such systems is heat management as LEDs only convert about 30% of the electric energy they consume, into visible light. The remaining energy, about 70%, is converted into heat. If that heat energy is not conducted away from the LEDs it can have a detrimental effect on performance.

Many performance characteristics of LEDs are influenced by the operating temperature. For example, as the LED temperature increases excessively, the light output decreases, the color of the light emitted shifts and the forward voltage decreases. Most importantly, the reliability of the LED decreases with excessive temperature. As a result, a primary cause of LED failures is improper thermal management. Thermal management, therefore, is a primary design concern in LED systems.

There is a need for an improved LED array assembly which overcomes some of the difficulties inherent in the—prior art systems. In particular, it is desirable that an improved LED array assembly be compact, cost-effective and easily assembled, while still addressing the issue of thermal management in such systems.

SUMMARY OF THE INVENTION

It is therefore an object of the invention to provide an improved LED array assembly which offers some operational advantage over the prior art.

One aspect of the invention is defined as an LED (light emitting diode) light array assembly comprising a base PCB (printed circuit board), and a set of LED array PCBs, each having one or more LEDs mounted thereon. The set of LED array PCBs are arranged to form a tower on said base PCB, mechanically interlocking together with one another.

Another aspect of the invention is defined as a method of assembly for a LED light array assembly comprising providing a base PCB; providing a set of LED array PCBs, each having one or more LEDs mounted thereon; and arranging the set of LED array PCBs on said base PCB to form a tower, mechanically interlocking said set of LED array PCBs together with one another.

Embodiments of this system and method provide, for example:

- ease of assembly due to the interlocking nature of the LED assembly;
- no Heat sink or/and thermal interface materials required since the chimney effect helps in circulating air through the interlocked LED circuit board assembly; and
- will not trap moisture buildup as any trapped moisture can escape through the bottom slots of the LED assembly.

Note that the focal point of the LED tower can be made to closer than shown in the Figures, to resemble a point source, and is only limited by how closely the LED circuit boards can be interlocked together.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

These and other features of the invention will become more apparent from the following description in which reference is made to the appended drawings in which:

FIG. 1 presents a perspective view of an LED light array assembly in an embodiment of the invention;

FIG. 1A presents an enlarged detail of the LED light array assembly of FIG. 1, showing the upper interlocking tabs and slots;

FIG. 1B presents an enlarged detail of the LED light array assembly of FIG. 1, showing the lower interlocking tabs and slots;

FIG. 1C presents a detail and partial sectional view of the LED light array assembly of FIG. 1, showing the electrical mechanical mounting tabs from the underside of the base PCB;

DESCRIPTION OF THE INVENTION

As noted above, there is a need for an improved LED array assembly which overcomes some of the difficulties inherent in prior art systems. In particular, it is desirable that an improved LED array assembly be compact, cost-effective and easily assembled, while still addressing the common issue of thermal management. As noted above, much of the electrical energy that goes into a high power light-emitting diode (LED) becomes heat rather than light (about 70% heat and 30% light). If this heat is not removed the LEDs run at a high temperature which compromises performance, lowers efficiency, and makes the LEDs less reliable.

An exemplary LED assembly which addresses one or more of the objects outlined above is presented in FIG. 1. This assembly consists of four separate and independent printed circuit boards (PCBs) 12, 14, 16, 18 which are arranged in an elongated square prism on a base PCB 20 to form a "tower", the four PCBs 12, 14, 16, 18 being mechanically interconnected by means of complementary slots and tabs. Each of the vertically arranged PCBs 12, 14, 16, 18 typically supports and provides power to one or more LEDs, although one or more of the PCBs 12, 14, 16, 18 may have no LEDs in some applications.

Although four PCBs 12, 14, 16, 18 are shown in the figures, any number could be used. A tower comprising three PCBs in a triangular prism configuration would result in a less expensive arrangement, though with less effective omni-directional coverage. A tower comprising five, six or more vertically-arranged PCBs would be more expensive, but would have improved coverage. Arrangements with larger numbers of vertically-arranged PCBs would allow the LEDs to be illuminated successively, simulating a rotating signal light. Regardless of the number of vertically-arranged PCBs, it is preferable to drive the LEDs in a blinking or flashing configuration as a reduced duty cycle reduces the amount of heat generated.

The four PCBs 12, 14, 16, 18 described herein all have the same physical dimensions, but this is not necessary either. Having PCBs of different dimensions would allow the tower to take on the shape of any kind of regular or irregular cuboid, prism or other 3-dimensional object.

Figure 3:
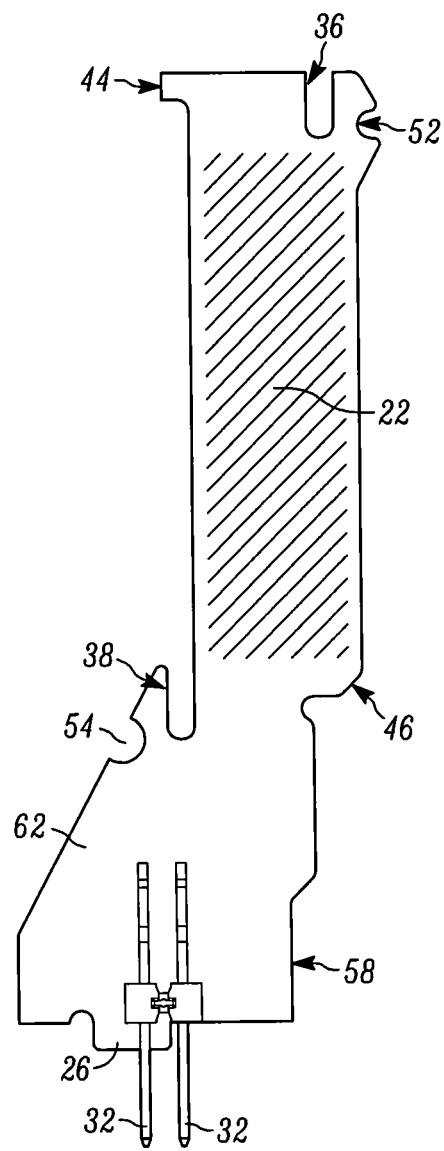
FIG. 3 presents a plan view of an LED light array assembly employing electrical connectivity pins in an embodiment of the invention.
Figure 4:
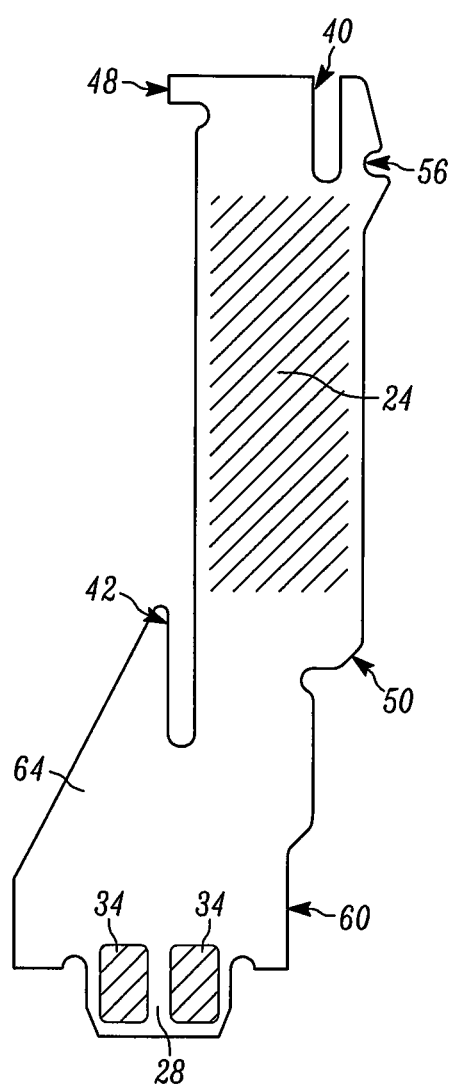
FIG. 4 presents a plan view of an LED light array assembly employing electrical connectivity solder pads in an embodiment of the invention.

Two exemplary designs for the generally planar PCBs 12, 14, 16, 18 are shown in FIGS. 3 and 4. As explained in greater detail hereinafter, it is generally desirable that a metal-clad PCB (MCPCB) be used because of its thermal advantages, but other materials could also be used for the PCBs. Each of the PCBs 12, 14, 16, 18 includes a generally rectangular surface area 22, 24 which may be populated with LEDs (not shown), providing the LEDs with mechanical support. One LED may be mounted on each PCB 12, 14, 16, 18 or many may be mounted, depending on the specifics of the design and the application.

The PCBs 12, 14, 16, 18 include electrically conducting tracks or traces (not shown) so that the LEDs may be fed with electricity from the base PCB 20. Driver and control circuits for the LEDs may be placed on the PCBs 12, 14, 16, 18 but it is preferable that these circuits be located on the base PCB 20 or elsewhere as these circuits may generate heat themselves. Locating these circuits on the PCBs 12, 14, 16, 18 will result in additional heat which must be dissipated.

Figure 2A:
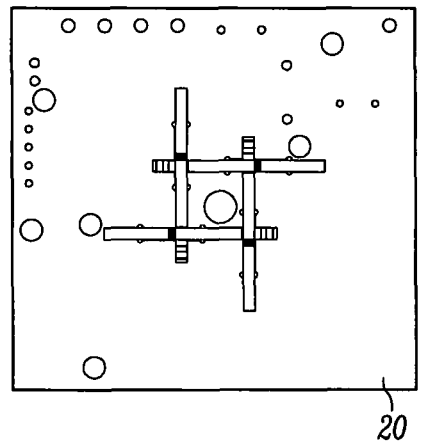
FIG. 2A presents a top plan view of the LED light array assembly of FIG. 1.
Figure 2B:
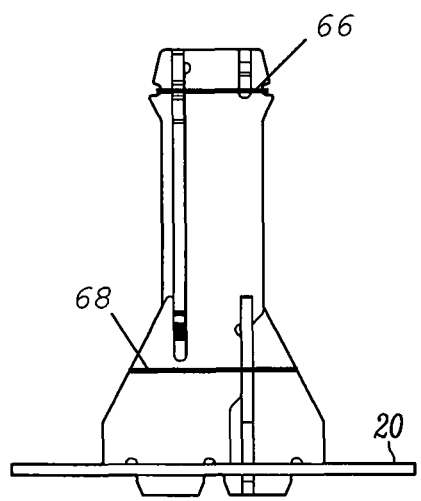
FIG. 2B presents a side plan view of the LED light array assembly of FIG. 1.
Figure 2C:
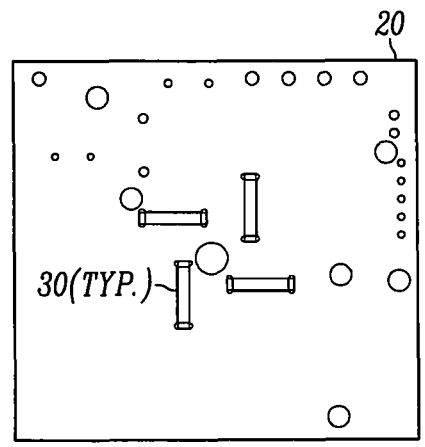
FIG. 2C presents a bottom plan view of the LED light array assembly of FIG. 1.

The actual mounting of each PCB 12, 14, 16, 18 to the base PCB 20 is effected by a tab 26, 28 at the bottom of each PCB 12, 14, 16, 18. The tab 26, 28 is sized to fit into an opening 30 in the base PCB 20 (see FIGS. 1C and 2C).

In the case of the embodiment of FIG. 3, electrical connectivity between the traces of the PCB 12, 14, 16, 18 and the base PCB 20 is accomplished through the use of the connectivity pins 32. While two such connectivity pins 32 are shown in FIG. 3, any practical number may be used. In the case of the embodiment of FIG. 4, electrical connectivity between the traces of the PCB 12, 14, 16, 18 and the base PCB 20 is accomplished through the use of solder tabs 34 on the tab 28. Other arrangements may also be used to feed electricity to the LEDs, for example, flexible wiring and electrical connectors may be used.

Each PCB 12, 14, 16, 18 includes a pair of slots 36, 38, 40, 42 and a pair of tabs 44, 46, 48, 50 which are used to mate with adjacent PCBs 12, 14, 16, 18. For example, FIG. 1A shows how the upper tab 48 of one PCB 12, 14, 16, 18 mates with the upper slot 40 of an adjacent PCB 12, 14, 16, 18. Similarly, FIG. 1B shows how the lower tab 50 of one PCB 12, 14, 16, 18 mates with the lower slot 42 of an adjacent PCB 12, 14, 16, 18.

Typically, the width of the slots 36, 38, 40, 42 will be same as the thickness of the PCB 12, 14, 16, 18 so that the tabs and slots fit snugly together. However, the length of the slots 36, 38, 40, 42 can vary as shown (that is, the slots in FIG. 4 are longer than the slots in FIG. 3). This can be done because it is not necessary for the tabs to bear against the bottom of the slots.

The dimensions of the embodiments shown and described herein are not limiting on the invention, but may assist in understanding. The overall height of the PCB in FIG. 3, for example, is 2.450 inches while the width is 0.900 inches. The overall height of the PCB in FIG. 4 is 2.300 inches while the width is 0.900 inches. The dimensions of the slots 36, 38, 40, 42 and tabs 44, 46, 48, 50 are quite flexible as the primary consideration is that they mate together in a complementary way. It is not necessary for the PCBs 12, 14, 16, 18 to "snap together", or to have sufficient interference that the slots and tabs engage to form a rigid structure in the absence of the base PCB 20. Exemplary dimensions of the embodiments of FIGS. 3 and 4 are as follows:

|  | Length | Width |
| --- | --- | --- |
| Upper Slot 36 | 0.170 inches | 0.070 inches |
| Lower Slot 38 | 0.190 inches | 0.070 inches |
| Upper Slot 40 | 0.270 inches | 0.070 inches |
| Lower Slot 42 | 0.360 inches | 0.070 inches |
| Upper Tab 44 | 0.070 inches | 0.070 inches |
| Lower Tab 46 | 0.060 inches | 0.060 inches |
| Upper Tab 48 | 0.070 inches | 0.070 inches |
| Lower Tab 50 | 0.060 inches | 0.060 inches |

Each PCB 12, 14, 16, 18 may also include one or more notches 52, 54, 56. These allow a "grip" feature to be implemented, that is, for a circumferential element 665, 68 (see FIG. 2B) such as an elastic band to be wrapped around the tower assembly to encircle the four PCBs 12, 14, 16, 18 holding them together until they can be mounted on the base PCB 20. This would allow towers to be assembled ahead of time and then placed on the base PCB 20, holding the tower together sufficiently for the base PCB 20 to be fed through a wave solder or similar device. These notches 52, 54, 56 have a radius of between 0.070-0.120 inches in the embodiments described herein but of course other shapes and dimensions may also be used.

The cutouts 58, 60 result in a gap occurring between adjacent PCBs 12, 14, 16, 18 at the bottom of the tower. This serves two purposes. Firstly, it allows for the drainage of any condensation that might enter the tower. Any time electrical components are involved which generate heat, it is likely that condensation will be generated. If the condensation is not removed, it is possible that corrosion and/or short circuits may occur. Secondly, the gap provided by cutouts 58, 60 allows air to enter the tower at the bottom, which encourages a "chimney effect" to occur. That is, as air inside the tower is heated, it will rise, drawing new air into the tower via the gap made by the cutouts 58, 60. This natural convection helps in cooling the LEDs and other components on the PCBs 12, 14, 16, 18.

Rather than using a cutout 58, 60 as shown, one could use a circular hole or notch at the bottom of the PCB 12, 14, 16, 18 to perform the same function. However, it is not desirable that the circular hole or notch be small enough or low enough that it might become plugged with debris during the life of the assembly. The cutouts shown in the figures have a width of about 0.065 inches and a height of about 0.310 inches, which would be effective for a PCB 12, 14, 16, 18 with the exemplary range of about 2.300-2.450 inches in height.

As shown in the Figures, each PCB 12, 14, 16, 18 also includes a flared triangle or delta-shaped portion 62, 64 at the base. This delta-shape portion 62, 64 is preferable over keeping the general shape of each PCB 12, 14, 16, 18 as a rectangle as it improves heat conduction to the base PCB 20, and improves the effectiveness of the "chimney effect". That is, having the delta-shape portion 62, 64 will result in a lower temperature at the base of each PCB 12, 14, 16, 18 causing a greater temperature gradient from the bottom to the top of the tower. The greater the temperature gradient, the better the "chimney effect".

MCPCB Considerations

Thermal management is a major issue when dealing with heat sensitive components such as high-powered LEDs, particularly when they are implemented in closed containers such as weather-proof enclosures, and when many of the components are high power and there is a high circuit density. The use of a Metal Core Printed Circuit Board (MCPCB) is advantageous in such applications.

MCPCBs (also called Metal Clad PCBs, Thermal Clad PCBs, T-Clad PCBs or Thermal Substrates) are constructed with a number of layers including an integral metal layer to assist with heat dissipation from electronic components. The metal core of an MCPCB may be for example, aluminum (aluminum clad PCB), an aluminum alloy, copper (copper clad PCB or a heavy copper PCB), copper alloy, or a mixture of special alloys. Iron alloy and carbon are also available on the market. The most commonly used is an aluminum clad PCB. The thickness of metal cores in PCB base is typically 30 mil-125 mil, but thicker and thinner plates are available.

The MCPCB also includes at least one of layer of metal tracing, typically a 1-10 Oz copper foil, so that the electrical components can be powered. The MCPCB also includes a dielectric sandwiched between the metal layers to provide electrical insulation. Typically, a dielectric polymer layer with high thermal conductivity for lower thermal resistance, is used for this purpose. FR4 is a common dielectric polymer layer, a glass-reinforced epoxy laminate sheet composite material composed of woven fiberglass cloth with an epoxy resin binder.

Choosing the type of material to use as a heat spreader depends on the application. For example, aluminum should be used if lower cost, lighter weight and gentle heat dissipation is required. In contrast, copper is higher cost, and heavier weight, but higher heat conductivity, meaning a higher heat dissipation rate. In the embodiments described herein, a one-sided, single-layer aluminum MCPCB was used for the four vertically-oriented PCBs 12, 14, 16, 18.

Other substrates are also being used as a heat dissipation media such as ceramic substrates like alumina, aluminum nitride, and beryllium oxide. However, these are higher in cost and do not offer the same mechanical strength as an MCPCB.

LED Considerations

As noted above, high power light-emitting diodes (LEDs) generate a considerable amount of heat energy. If this heat is not removed, the LEDs will operate at excessively high temperatures, which has a negative effect on the performance and efficiency of the LED system, as well as making the system less reliable.

Heat is generated in LEDs by a semiconductor PN (positive-negative) junction. Fortunately, more of the heat generated by the PN junction is conducted through the back side of the chip. It can then be conducted through a lengthy path from the PN junction/LED, to the solder point, to the MCPCB or similar circuit board, to a heat sink mounted behind the board, and then to the atmosphere. Some heat will dissipate in other manners (convection, radiation, etc.), but this is the primary route and the one of greatest concern in this design.

High-power LEDs are often provided with a metal tab (i.e. a thermal junction tab) which provides a reliable way of mounting them as the thermal junction tab may be soldered to the circuit board. But the thermal junction tab also provides an efficient way of conducting heat away from the LED. It is preferable that such LEDs be used in implementing the invention, soldering the tab to the MCPCBs.

Method of Implementation method of fabricating an LED light array assembly in an embodiment of the invention may comprise the following:

1. fabricate a base FR4/MCPCB with the necessary traces and electrical components, populated with the necessary electronic components, which may include an LED driver circuit;
2. fabricate a set of MCPCB LED-array PCBs;
3. populate the set of LED array MCPCBs with the desired LEDs and other components. In the case of high-power LEDs each LED will typically have a thermal tab or junction which may be soldered to the LED array PCBs;
4. the set of LED array MCPCBs are then arranged to form a tower, by mechanically interconnecting the pairs of tabs and slots of the respective LED array MCPCBs together with one another. One or more elastic bands 66, 68 may be placed around the perimeter of said tower, around notches on the edges of the LED array PCBs;
6. the LED array MCPCB tower is then placed on the base PCB 20; and
7. the LED array MCPCB tower is wave soldered to the base PCB 20.

Advantages

The system and method of the invention provides a lower cost solution than systems in the art, with better heat dissipation and greater reliability.

Low cost components are used and can easily be assembled with minimal labour and using existing equipment. For example, less soldering is required than with most tower arrangements used in the art. Typical LED towers must be soldered together by hand prior to be mounted on the base PCB. In contrast, the system of the invention uses tower components that are assembled together without any tools, the vertical PCBs simply being interlocked together because of their advantageous shape and dimensions, as well as their complementary tabs and notches.

As noted above, excessive heat reduces the efficiency and reliability of LED systems. The efficient thermal management of the invention will increase the life of the system, reduce failure rates, enable the design of high circuit densities, and enable the use of higher power densities. The system of the invention also addresses issues such as condensation, by the use of drainage holes. This also improves the reliability of the system.

The arrangement described herein may be used in any LED lighting application, but the primary application in mind is in the implementation of warning lights. Warning lights are useful and desirable on many types of vehicles, machinery, and other objects (buildings, towers, people, animals, etc.) to announce the presence, location, operation mode, status, or function of the vehicle, machine, process or event.

Options and Alternatives

The invention has been described with respect to particular examples and embodiments, but many options and alternatives may be used. For example:

1. when the thermal load of an LED system is too high to be properly dissipated by passive means, active cooling may be the only solution. Passive heat sinks are always preferred for many reasons, but actively cooled heat sinks can be used if high thermal load is a problem. There are many types of actively cooled systems, from fans to liquid cooling to heat pipes to other exotic methods. The effectiveness, reliability, noise, cost, added power consumption and maintenance of these devices need to be considered in the design; and 2. environmental sensors such as light and temperature sensors may also be employed to accommodate thermal issues. For example, a light sensor may detect dark lighting conditions which allows the LEDs to be driven at lower power, thus reducing the thermal load. And a temperature sensor within an LED enclosure may sense when the ambient temperature is rising to a dangerously high level, so that controls may be effected to reduce the duty cycle or illumination power.

CONCLUSIONS

The new LED lighting array may be used in many of the traditional LED applications and in warning light applications in particular. While particular embodiments of the present invention have been shown and described, it is clear that changes and modifications may be made to such embodiments without departing from the true scope and spirit of the invention.

All citations are hereby incorporated by reference.

In the Summary above and in the Detailed Description of Preferred Embodiments and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, that feature can also be used, to the extent possible, in combination with and/or in the context of other particular aspects and embodiments of the invention, and in the invention generally.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. An LED (light emitting diode) light array assembly comprising:
    a base PCB (printed circuit board); and
    a set of LED array PCBs, each of said LED array PCBs having one or more LEDs mounted thereon; and the set of LED array PCBs being arranged to form a tower on said base PCB, each of said LED array PCBs having a substantially rectangular portion with a height and a width, the height being substantially greater than the width, and each substantially rectangular portion includes:
        an upper slot having a downward formed opening on an upper right corner edge of the rectangular portion;
        a lower slot having a downward formed opening along a lower left corner edge of the rectangular portion;
        an upper edge tab on an upper left corner edge of the rectangular portion; and
        a lower edge tab on a lower right corner edge of the rectangular portion, each of the rectangular portions mechanically interlocking together with one another, wherein each of the upper edge tabs of the upper left corner of said LED array PCBs is received in the upper slot of the upper right corner edge of another one of said LED array PCBs, and the lower edge tab of the lower right corner edge of the other LED array PCB is received in each of the lower slots of the lower left corner edge of said LED array PCBs to form the tower.

2. The LED light array assembly for claim 1, wherein each of said LED array PCBs is mounted perpendicularly to the base PCB.

3. The LED light array assembly of claim 1, wherein each of said LED array PCBs includes vertical tabs, and the base PCB includes slots sized to fit the vertical tabs.

4. The LED light array assembly of claim 1, wherein at least one of said LED array PCBs comprises an opening formed at the bottom of the tower for drainage of condensation, and to allow air to enter the tower.

5. The LED light array assembly of claim 1, wherein at least one of said LED array PCBs comprises a notch for drainage of condensation and to allow air to enter the tower.

6. The LED light array assembly of claim 1, wherein each of said LED array PCBs comprises a notch on an outside edge and said LED light array assembly further comprises a circumferential retainer to encircle said LED array PCBs forming the tower, via said notches without being attached to said base PCB.

7. The LED light array assembly of claim 6, wherein said retainer comprises an elastic band.

8. The LED light array assembly of claim 1, wherein the LED array PCBs are soldered to the base PCB, but are not soldered to one another.

9. The LED light array assembly of claim 1, wherein the LED array PCBs comprise one-sided PCBs.

10. The LED light array assembly of claim 1, wherein the LED array PCBs comprise metal-core PCBs.

11. The LED light array assembly of claim 1, wherein the LED array PCBs comprise single-layer metal-core PCBs.

12. The LED light array assembly of claim 1, wherein the LED array PCBs comprise four LED array PCBs.

13. The LED light array assembly of claim 12, wherein the four LED array PCBs are arranged at 90 degree angles to one another.

14. The LED light array assembly of claim 1, wherein the one or more LEDs are arranged to be driven in a reduced duty cycle comprising blinking or flashing by a control circuit, the reduced duty cycle reducing heat generation by the one or more LEDs.

15. The LED light array assembly of claim 1, wherein each of the LED array PCBs includes a single LED.

16. The LED light array assembly of claim 1, wherein each of the LED array PCBs is wider in a lower portion than in an upper portion resulting in the upper portion generally having a higher temperature than the lower portion, complementing a chimney effect.

17. The LED light array assembly of claim 16, wherein the lower portion of each of the LED array PCBs comprises a delta shape.

18. A method of assembly for a LED light array assembly comprising:
providing a base PCB;
providing a set of LED array PCBs, each of said LED array PCBs having one or more LEDs mounted thereon;
providing each of said LED array PCBs with a substantially rectangular portion having a height and width, the height being substantially greater than the width,
providing each of said substantially rectangular portions with an upper slot having a downward formed opening on an upper right corner edge of the rectangular portion, a lower slot having a downward formed opening along a lower left corner edge of the rectangular portion, an upper edge tab on an upper left corner edge of the rectangular portion, and a lower edge tab on a lower right corner edge of the rectangular portion, and
arranging the set of LED array PCBs on said base PCB to form a tower,
mechanically interlocking each of said LED array PCBs together, wherein each of the upper edge tabs of the upper left corner of said LED array PCBs is received in the upper slots of the upper right corner edge of another one of said LED array PCBs, and the lower edge tab of the lower right corner edge of the other LED array PCB is received in each of the lower slots of the lower left corner edge of said LED array PCBs to form the tower.

19. The method of assembly of claim 18 wherein said arranging further comprises soldering said tower to said base PCB.

20. The method of assembly of claim 18 wherein said arranging further comprises wave soldering said tower to said base PCB.

21. The method of assembly of claim 18 wherein said arranging comprises an earlier step of holding the set of LED array PCBs in said tower configuration by placing one or more elastic bands around a perimeter of said tower, along notches on edges of the LED array PCBs.

22. The method of assembly of claim 18, wherein said mechanically interlocking step further includes the step of not soldering the LED array PCBs to one another, and said arranging step includes soldering the LED array PCBs to the base PCB.

* * * * *